(12) United States Patent
Seki

(10) Patent No.: US 7,656,177 B2
(45) Date of Patent: Feb. 2, 2010

(54) TEST APPARATUS

(75) Inventor: Nobusuke Seki, Tokyo (JP)

(73) Assignee: Advantest Corporation, Tokyo (JP)

( * ) Notice: Subject to any disclaimer, the term of this patent is extended or adjusted under 35 U.S.C. 154(b) by 319 days.

(21) Appl. No.: 11/688,878

(22) Filed: Mar. 21, 2007

(65) Prior Publication Data

US 2008/0174318 A1    Jul. 24, 2008

Related U.S. Application Data

(63) Continuation-in-part of application No. PCT/JP2005/019794, filed on Oct. 27, 2005.

(30) Foreign Application Priority Data

Nov. 16, 2004 (JP) .............................. 2004-332466

(51) Int. Cl.
*G01R 31/02* (2006.01)
*G01R 31/26* (2006.01)
(52) U.S. Cl. ...................... 324/755; 324/765
(58) Field of Classification Search ............ 324/755
See application file for complete search history.

(56) References Cited

FOREIGN PATENT DOCUMENTS

| JP | 07-248353 | 9/1995 |
|---|---|---|
| JP | 09-043284 | 2/1997 |
| JP | 10-213608 | 8/1998 |
| JP | 2002-071755 | 3/2002 |
| WO | WO 2006/054435 | 5/2006 |

*Primary Examiner*—Ha Tran T Nguyen
*Assistant Examiner*—Roberto Velez
(74) *Attorney, Agent, or Firm*—Jianq Chyun IP Office

(57) ABSTRACT

There is provided a test apparatus that tests an electronic device. The test apparatus includes a socket board in which a socket for mounting thereon the electronic device is provided, and a test head that detachably holds the socket board and transmits source power to the electronic device via the socket board, the test head includes a first source power transmission line that transmits the source power to the socket board, a first bypass capacitor that is provided between the first source power transmission line and ground potential, and a switch that switches whether the first bypass capacitor is connected between the first source power transmission line and the ground potential, and the socket board includes a second source power transmission line that transmits the source power to the electronic device, and a second bypass capacitor that is fixedly connected between the second source power transmission line and the ground potential.

9 Claims, 3 Drawing Sheets

TEST APPARATUS

CROSS REFERENCE TO RELATED APPLICATION

This is a continuation in-part application of PCT/JP2005/019794 filed on Oct. 27, 2005, which claims priority from a Japanese Patent application No. 2004-332466 filed on Nov. 16, 2004, the contents of which are incorporated herein by reference.

BACKGROUND

1. Field of the Invention

The present invention relates to a test apparatus that tests an electronic device such as a semiconductor circuit.

2. Related Art

Conventionally, a test apparatus for testing an electronic device has had a configuration including a mainframe that is the test apparatus main body, a socket board that mounts thereon the electronic device, and a test head that holds the socket board. The mainframe generates test patterns and source power to be supplied to the electronic device, and supplies them to the test head via cables.

Moreover, a power supply line of the socket board for transmitting source power to the electronic device has a bypass capacitor hi the vicinity of the electronic device. The provision of the bypass capacitor can reduce noises in the power supply line and follow fluctuation of power supply currents at high speed.

As an example of a test for the electronic device, there is also known a test for measuring power supply currents of the electronic device. When performing such a test, it is difficult to measure the power supply currents with high precision due to leakage currents of the bypass capacitor. For this reason, the socket board has a relay that switches whether the bypass capacitor and the power supply line is connected or not.

However, there is developed a more undersized socket board in terms of uniformity of temperature distribution or machine precision in connection with the test head. Moreover, in order to improve test efficiency, the number of electronic devices simultaneously examined increases and thus the number of electronic devices mounted on the socket board increases. For this reason, it becomes difficult to guarantee a region mounting the bypass capacitor and the relay.

Moreover, wires for controlling a relay and wires for use in a relay driving power supply become necessary when providing the bypass capacitor and the relay in the socket board. For this reason, since an area of the socket board should be increased, it is difficult to be compatible with the above-described miniaturization.

For example, when providing the bypass capacitor and the relay in the test head, the area of the socket board can be reduced. However, since noises or the like generated from power supply lines between the test head and the electronic device cannot be removed, the electronic device cannot be tested with high precision.

SUMMARY

Therefore, it is an object of the present invention to provide a test apparatus that can solve the foregoing problems. The above and other objects can be achieved by combinations described in the independent claims. The dependent claims define further advantageous and exemplary combinations of the present invention.

That is, according to the first aspect of the invention, there is provided a test apparatus that tests an electronic device. The test apparatus includes: a socket board in which a socket for mounting thereon the electronic device is provided; and a test head mat detachably holds the socket board and transmits source power to the electronic device via the socket board, the test head includes: a first source power transmission line that transmits the source power to the socket board; a first bypass capacitor that is provided between the first source power transmission line and ground potential; and a switch that switches whether the first bypass capacitor is connected between the first source power transmission line and the ground potential, and the socket board includes: a second source power transmission line that transmits the source power to the electronic device; and a second bypass capacitor that is fixedly connected between the second source power transmission line and the ground potential.

The summary does not necessarily describe all necessary features of the present invention. The present invention may also be a sub-combination of the features described above.

DESCRIPTION Of EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
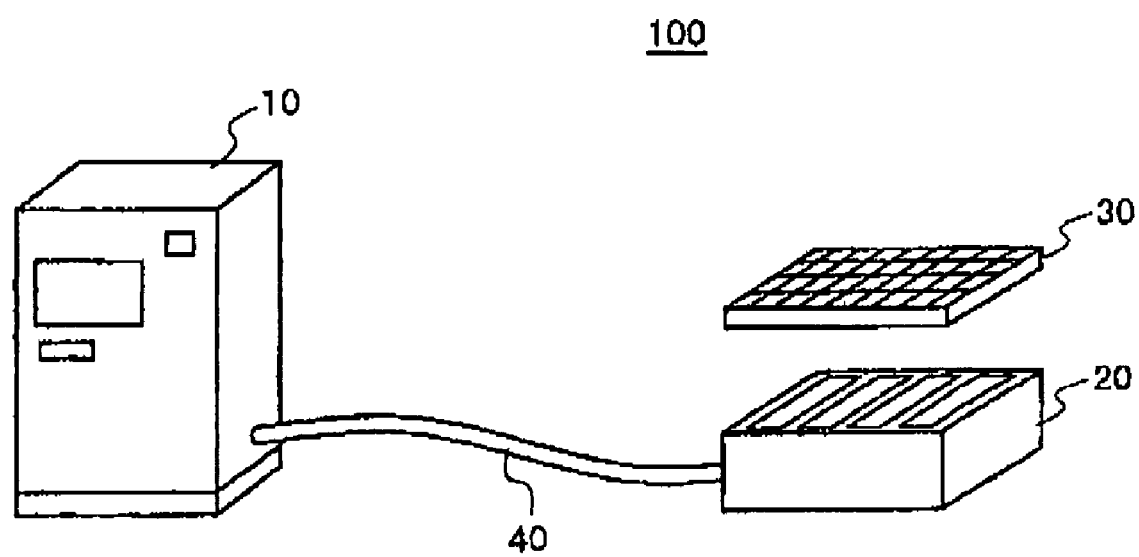
FIG. 1 is a view exemplary showing a configuration of a test apparatus 100 according to an embodiment of the present invention.

FIG. 1 is a view exemplary showing a configuration of a test apparatus 100 according to an embodiment of the present invention. The test apparatus 100 is an apparatus that tests an electronic device such as a semiconductor circuit, and includes a mainframe 10, a test head 20, a socket board 30, and a cable 40. The mainframe 10 generates test patterns and source power to be supplied to the electronic device.

The test, head 20 receives test patterns and source power via the cable 40, and supplies them to the socket board 30. Moreover, the test head 20 detachably holds the socket board 30. In other words, the test apparatus 100 can test various electronic devices by means of changing the socket board 30 for each type of electronic devices under test, for example.

The socket board 30 has a socket for mounting thereon the electronic device, and supplies test patterns and source power provided from the test head 20 to the electronic device. Moreover, the socket board 30 may have a plurality of sockets. In this case, the mainframe 10 may generate test patterns and power supply currents for each electronic device mounted on each socket. Moreover, the test head 20 controls which of the electronic devices is supplied with test patterns and source power received from the mainframe 10. For example, the test head 20 controls which of the electronic devices is supplied with the received test patterns and source power by means of switching connection of wires.

Figure 2:
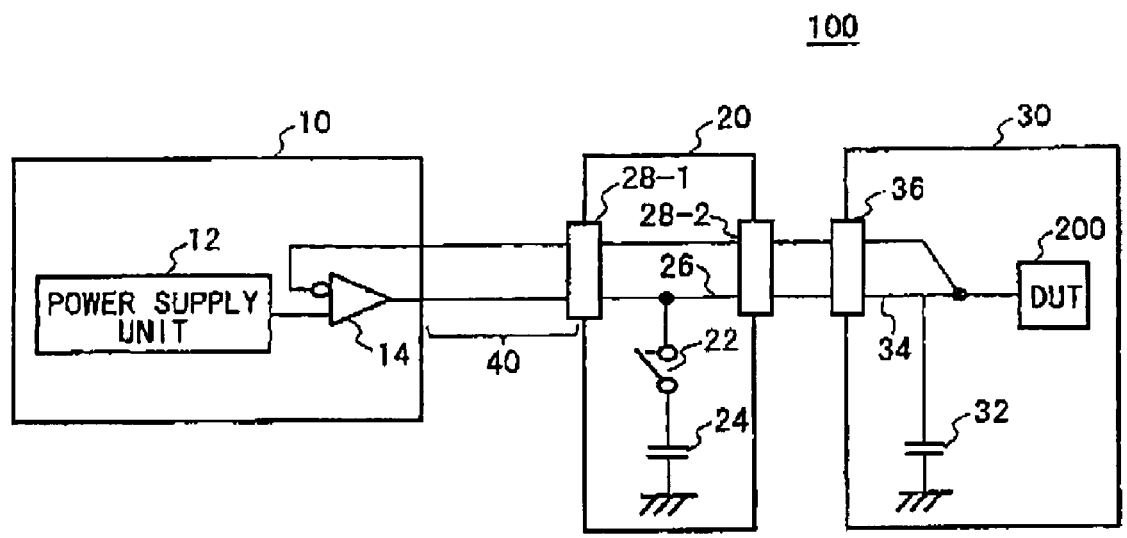
FIG. 2 is a view exemplary showing a configuration supplying source power to an electronic device 200 in a configuration including a mainframe 10, a test head 20, and a socket board 30.

FIG. 2 is a view exemplary showing a configuration supplying source power to an electronic device 200 in a configuration including the mainframe 10, the test head 20, and the socket board 30. The mainframe 10 includes a power supply unit 12 and a voltage control circuit 14. The power supply unit 12 outputs a predetermined power supply voltage. The voltage control circuit 14 is a differential amplifier, and receives a power supply voltage generated from the power supply unit 12 via a positive input terminal and receives a power supply voltage to be input into a power-supply pin of the electronic device 200 via a negative input terminal. In other words, the voltage control circuit 14 controls the power supply voltage output from the mainframe 10 to a predetermined voltage value by means of feeding back the power supply voltage to be input into the power-supply pin of the electronic device 200.

The test head 20 has an input section 28-1, an output section 28-2, a relay 22 that is an example of a switch, a first bypass capacitor 24, and a source power transmission line 26. The input section 28-1 receives source, power via the cable 40, and transmits it 10 the output section 28-2 via the source power transmission line 26. The source power transmission line 26 is an example of a first source power transmission line.

The first bypass capacitor 24 is provided between the source power transmission line 26 and ground potential that is an example of reference potential. The relay 22 switches whether the first bypass capacitor 24 is connected between the source power transmission line 26 and reference potential. In the present example, the first bypass capacitor 24 is connected to the source power transmission line 26 via the relay 22. Moreover, the first bypass capacitor 24 may be connected to the ground potential via the relay 22.

The socket board 30 has an input section 36, a source power transmission line 34, and a second bypass capacitor 32. Moreover, the socket board 30 mounts the electronic device 200 on a socket not shown. The input section 36 supplies the received source power to the electronic device 200 via the source power transmission line 34. The source power transmission line 34 is an example of a second source power transmission line. The second bypass capacitor 32 is provided between the source power transmission line 34 and the ground potential, and is fixedly connected between the source power transmission line 34 and the ground potential. In other words, the second bypass capacitor 32 is connected to the source power transmission line 34 and the ground potential not via a relay.

In this manner, since the first bypass capacitor 24 is provided in the test head 20 separately from the second bypass capacitor 32 provided in the socket board 30, the second bypass capacitor 32 with a small capacity can be used. For this reason, when measuring power supply currents of the electronic device 200, it is possible to reduce an influence of a leakage current in the second bypass capacitor 32. Moreover, since an influence of a leakage current in the second bypass capacitor 32 is small, it is not necessary to provide a relay for disconnecting the second bypass capacitor 32 from the source power transmission line 34. For this reason, the socket board 30 can be miniaturized. Moreover, noises generated between the mainframe 10 and the test head 20 can be reduced by the first bypass capacitor 24, and noises generated between the test head 20 and the electronic device 200 can be reduced by the second bypass capacitor 32. Therefore, it is possible to test the electronic device 200 with high precision. In other words, according to the test apparatus 100 in the present, example, the miniaturization of the socket board 30 and the precise test for the electronic device 200 can be compatible with each other.

Moreover, electric power transmission distance between the mainframe 10 and the test head 20 is usually larger than electric power transmission distance between the test head 20 and the electronic device 200. For example, the length of the cable 40 is usually more than several meters, and the electric power transmission distance between the test head 20 and the electronic device. 200 is usually several ten centimeters to about one meter. In this case, it is preferable that the capacity of the first bypass capacitor 24 is larger than the capacity of the second bypass capacitor 32.

An amount of noises occurring in a transmission line is usually proportional to the length of transmission line. For this reason, it is preferable that the first bypass capacitor 24 has a capacity according to the electric power transmission distances between the mainframe 10 and the test head 20 and the second bypass capacitor 32 has a capacity according to the electric power transmission distance between the test head 20 and the electronic device 200. For example, the first bypass capacitor 24 may have a capacity substantially proportional to the electric power transmission distances between the mainframe 10 and the test head 20, and the second bypass capacitor 32 may have a capacity substantially proportional to the electric power transmission distance between the test head 20 and the electronic device 200. As an example, the capacity of the first bypass capacitor 24 may be about 10 μF to 100 μF, and the capacity of the second bypass capacitor 32 may be less than 1 μF.

Moreover, the first bypass capacitor 24 may have a capacity according to operating frequency of the electronic device 200. For example, the first bypass capacitor 24 may have a capacity substantially inversely proportional to the operating frequency of the electronic device 200. Moreover, it is preferable that the first bypass capacitor 24 has a capacity capable of following fluctuation frequency of power supply currents being supplied to the electronic device 200. Although response speeds for charging and discharging of the first bypass capacitor 24 vary according to the capacity, the first bypass capacitor 24 may have a capacity so that the response speeds are a response speed equal to operating frequency of the electronic device 200.

Moreover, the first bypass capacitor 24 may have a capacity according to the size of fluctuation of power supply currents when a state of the electronic device 200 transits from a quiescent state to an operating state. For example, the first bypass capacitor 24 may have a capacity substantially proportional to the size of fluctuation of the power supply currents. A quiescent state is, for example, a state where a power supply current of the electronic device 200 is the smallest amount, and an operating state is, for example, a state where a power supply current of the electronic device 200 is the largest amount. Although fluctuation velocity of the power supply currents output from the voltage control circuit 14 is slow because the first bypass capacitor 24 has the capacity according to the size of fluctuation of such power supply currents, it is possible to supply power supply currents following fluctuation of consumption currents of the electronic device 200 at high speed.

Moreover, the test head 20 may further have the first bypass capacitor 24 with a different capacity, and select the first bypass capacitor 24 to be connected to the source power transmission line 26 in accordance with the operating frequency of the electronic device 200 and the size of fluctuation of power supply currents.

Figure 3:
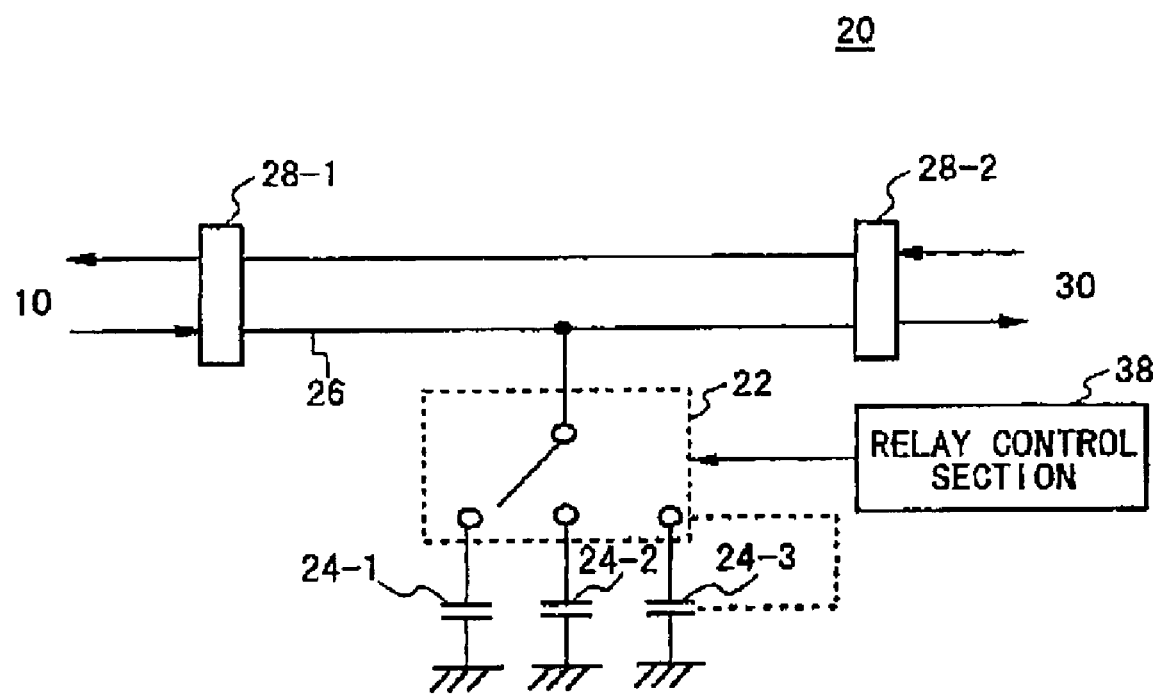
FIG. 3 is a view showing another example of a configuration of a test head 20.

FIG. 3 is a view showing another example of a configuration of the test head 20. The test head 20 in the present example has an input section 28-1, an output section 28-2, a relay 22, a plurality of first bypass capacitors 24-1, 24-2, and 24-3 (hereinafter, referred to as 24), a source power transmission line 26, and a relay control section 38.

The functions of the input section 28-1, the output section 28-2, and the source power transmission line 26 are equal to those of the input section 28-1, the output section 28-2, and the source power transmission, line 26 described in FIG. 2. The plurality of first bypass capacitors 24 are provided in parallel with each other between the source power transmission line 26 and ground potential, and respectively have different capacities.

The relay 22 selects which of the first bypass capacitors 24 is connected between the source power transmission line 26 and the ground potential. The relay control section 38 controls which of the first bypass capacitors 24 is selected by the relay 22. For example, the relay control section 38 makes the relay. 22 select the first bypass capacitor 24 having a capacity according to the operating frequency of the electronic device 200 or the size of fluctuation of power supply currents that are described above. According to this, it is possible to select the first .bypass capacitor 24 according to a characteristic of the electronic device 200 to be tested.

The relay control section .38 may control which of the first bypass capacitors 24 is selected according to information given by a user. For example, information showing which of the first bypass capacitors 24 is selected is given by the user, and the relay control section 38 may control the relay 22 based on this information.

Moreover, the relay control section 38 may measure the operating frequency of the electronic device 200 or the size of fluctuation of power supply currents, and control the relay 22 in accordance with the measured value. In this case, the test apparatus 100 may supply patterns, which causes the relay control section 38 to measure the operating frequency of the electronic device 200 or the size of fluctuation of power supply currents, to the electronic device 200. Then, the relay control section 38 may detect a power supply voltage or a power supply current passing through the source power transmission line 26, and measure the operating frequency of the electronic device 200 or the size of fluctuation of power supply currents.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, the miniaturization of the socket board and the precise test for the electronic device can be compatible.

What is claimed is:

1. A test apparatus that tests an electronic device, comprising:
   a socket board in which a socket for mounting thereon the electronic device is provided; and
   a test head that detachably holds the socket board and transmits source power to the electronic device via the socket board,
   the test head comprising:
   a first source power transmission line that transmits the source power to the socket board;
   a first bypass capacitor that is provided between the first source power transmission line and ground potential; and
   a switch that switches whether the first bypass capacitor is connected between the first source power transmission line and the ground potential, and
   the socket board comprising:
   a second source power transmission line that transmits the source power to the electronic device; and
   a second bypass capacitor that is fixedly connected between the second source power transmission line and the ground potential.

2. The test apparatus as claimed in claim 1, wherein a capacity of the first bypass capacitor is larger than a capacity of the second bypass, capacitor.

3. The test apparatus as claimed in claim 2, wherein
   the test apparatus further comprises a mainframe that generates the source power, and
   electric power transmission distance between the mainframe and the test head is larger than electric power transmission distance between the test head and the electronic device.

4. The test apparatus as claimed in claim 3, wherein the first bypass capacitor has a capacity according to the electric power transmission distance between the mainframe and the test head.

5. The test apparatus as claimed in claim 1, wherein the first bypass capacitor has a capacity according to operating frequency of the electronic device.

6. The test apparatus as claimed in claim 1, wherein the first bypass capacitor has a capacity according to the size of fluctuation of power supply currents supplied to the electronic device when a state of the electronic device transits from a quiescent state to an operating state.

7. The test apparatus as claimed in claim 1, wherein the first bypass capacitor further comprises first bypass capacitors with different capacities, and the switch selects which one of the plurality of first bypass capacitors is connected between the first source power transmission line and the ground potential.

8. The test apparatus as claimed in claim 7, further comprising a relay control section that makes the switch select one of the plurality of first bypass capacitors with a capacity according to an operating frequency of the electronic device.

9. The test apparatus as claimed in claim 7, further comprising a relay control section that makes the switch select one of the plurality of first bypass capacitors with a capacity according to the size of fluctuation of power supply currents supplied to the electronic device when a state of the electronic device transits from a quiescent state to an operating state.

* * * * *